United States Patent [19]

Kowalski

[11] Patent Number: 4,916,333

[45] Date of Patent: Apr. 10, 1990

[54] BINARY LOGIC LEVEL ELECTRICAL DETECTOR NAMELY TO PREVENT THE DETECTION OF SECRET CODES CONTAINED IN A MEMORY CARD

[75] Inventor: Jacek Kowalski, Trets, France

[73] Assignee: SGS Thomson Microelectronics SA, Gentilly, France

[21] Appl. No.: 212,888

[22] Filed: Jun. 29, 1988

[30] Foreign Application Priority Data

Jul. 10, 1987 [FR] France .................. 87 09790

[51] Int. Cl.$^4$ .................. G06F 7/04; G06K 5/00; G06K 7/01; H03K 17/30

[52] U.S. Cl. .................. 307/296.5; 307/296.4; 307/362; 307/530; 307/585; 365/196; 361/172; 361/171; 340/825.31; 340/825.32

[58] Field of Search ............... 307/200 B, 296 R, 297, 307/296 A, 296.5, 296.1, 279, 304, 362, 363, 530, 450, 451, 448, 585, 576, 579, 465, 468, 469, 202.1; 365/196, 203, 205; 361/170, 171, 172; 340/825.31, 825.32

[56] References Cited

U.S. PATENT DOCUMENTS

| | | | |
|---|---|---|---|
| 4,084,105 | 4/1978 | Teranishi et al. | 307/468 X |
| 4,409,434 | 10/1983 | Basset et al. | 307/468 X |
| 4,434,381 | 2/1984 | Stewart | 307/530 |
| 4,563,595 | 1/1986 | Bose | 307/296.8 |
| 4,593,384 | 6/1986 | Kleijne | 307/202.1 X |
| 4,706,011 | 11/1987 | Vergara et al. | 307/363 X |
| 4,716,320 | 12/1987 | McAdams | 365/205 X |
| 4,724,339 | 2/1988 | Ishida | 307/362 |
| 4,743,898 | 5/1988 | Imedio | 340/825.31 |
| 4,755,815 | 7/1988 | Savoyet et al. | 361/172 X |
| 4,763,023 | 8/1988 | Spence | 307/362 X |
| 4,783,801 | 11/1988 | Kaule | 307/202.1 X |

FOREIGN PATENT DOCUMENTS

| | | | |
|---|---|---|---|
| 0044066 | 1/1982 | European Pat. Off. | 307/482 |
| 0130587 | 1/1985 | European Pat. Off. | 307/482 |

OTHER PUBLICATIONS

Ser. Nos. 07/176,335, 07/212,890 of Jacek Kowalski.

Primary Examiner—Stanley D. Miller
Assistant Examiner—David R. Bertelson
Attorney, Agent, or Firm—Roland Plottel

[57] ABSTRACT

To prevent fraudulent action by ill-intentioned users, the detection of the secret codes, contained in a memory card with MOS integrated circuit and transmitted to an input/output unit, is prevented. This is done by interposing a read amplifier in the transmission chain, in the integrated circuit itself. This read amplifier essentially has two parallel-connected identical circuits, designed to take complementary logic states when they receive one and the same logic level to be detected. The result of this is that the electrical comsumption of the amplifier is the same regardless of the logic level transmitted. Thus, it becomes impossible to deduce the nature of the logic level transmitted. As an improvement, the outputs of the detector are provided with bistable circuits which are coupled to each other so as to be capable of taking transitory or spurious information detected into account.

10 Claims, 2 Drawing Sheets

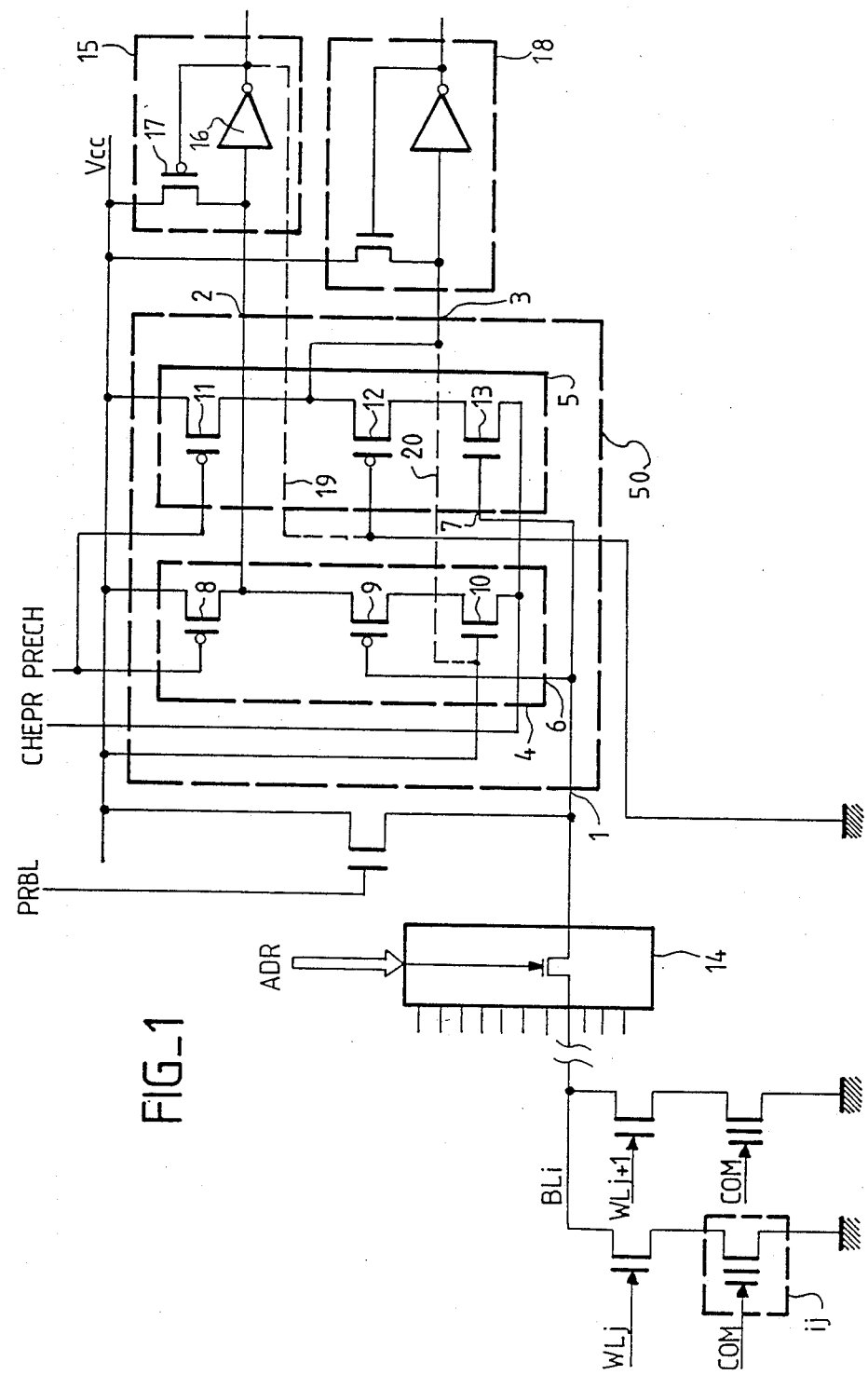
FIG_1

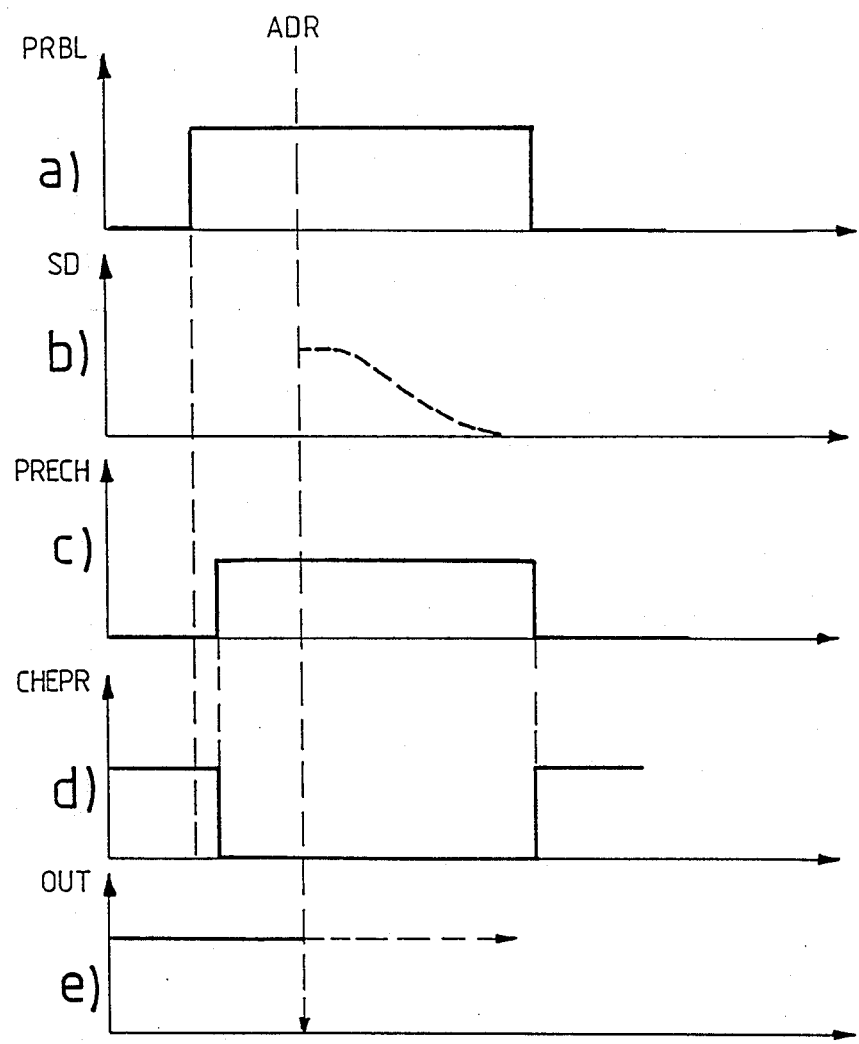
FIG_2

BINARY LOGIC LEVEL ELECTRICAL DETECTOR NAMELY TO PREVENT THE DETECTION OF SECRET CODES CONTAINED IN A MEMORY CARD

BACKGROUND OF THE INVENTION

1. Field of the Invention

An object of the present invention is an electrical detector of binary logic levels. It can be applied in computer technology and, more especially, to memory cards fitted with micro-processors and MOS memory circuits of the non-volatile type (EPROMS or EEPROMS). The invention also concerns read amplifiers for data contained in random-access static or dynamic type electronic memories.

2. Description of the Prior Art

The use of memory cards is undergoing major growth. The most extensive use here relates to banking where memory cards with incorporated integrated circuits will ultimately replace cheque books and become a universal means of economic transaction. Whatever the financial operations performed with a card of this type, this card should contain two types of information. A first type of information concerns bank balances. This information gives an account of the balance before and after each operation. This information on a bank balance should be accessible to the user. It is confidential and yet, at the same time, needs to be known. Other information, on the contrary, should remain secret. Some information should be kept secret to all except the holder of the card: in this case it is his secret code which validates an operation performed with this card. Other information should remain secret to everybody including the holder of the card: in general, this is information used to prepare the secret code which is known only to the holder and therefore cannot be reconstituted by electrical manipulation of the card. Unfortunately, the imagination of fraudulent persons knows no bounds and preventive measures have to be taken against all attempts to decipher secret information contained in cards.

Thus, it has been realized that an informed fraudulent person might try to measure the electrical consumption of a biasing circuit of the system for reading information contained in a card so that, by measuring the variation in electrical consumption, he can determine the form of the logic levels put through by the card thereby deducing the secret codes registered therein. For the memory points of integrated circuit memory cards are often of the type having a transistor with two gates: one control gate and one floating gate. Charges trapped in the floating gate may counter the turning on of the transistor in response to a command applied to the control gate and may thus reveal their presence while their absence would make the transistor conductive and would provoke, in a measuring circuit that is series connected with this transistor, a variation in the signal introduced into it. The programming of a memory of this type can therefore be done by trapping or not trapping charges of this type in the floating gates of these transistors. However, from one situation to another, the electrical power thus used is low. And the information must be amplified so that it can be transmitted properly up to a reading unit or up to a unit for executing a financial transaction.

In practice, these amplifiers are made in a simple way using CMOS technology with two transistors of reverse conductivity, namely one P-type transistor and one N-type transistor, series connected and biased between the supply voltage Vcc of the circuit and the ground. The gates of these transistors are connected together and receive the signal, to be amplified. The output is taken at the midpoint of these transistors. This amplifier assembly is an inverting one. The disadvantage of an inverter of this type, used as an amplifier, is that it has a major difference in consumption depending on whether it has to transmit a logic "1" state or a logic "0" state. And the current that flows through this amplifier thus reveals the logic state read by its value. For, when it consumes more current, the internal impedance of the biasing generator causes a drop in the supply voltage which can be used in this direction. Regardless of the improvements made in these generators, since the connection circuits of this supply to the cards are circuits with contacts, hence necessarily resistive circuits, they play the role of an internal resistor of this type and cause a drop in the revealing voltage.

Furthermore, in dynamic type memory circuits, the logic level information to be detected is transient. A given logic level may be detected all the more efficiently as as this transient information is converted into information that is maintained for at least a certain period of time. Furthermore, when it is not doing its detection, a detector of this type must display the lowest possible static consumption. For it is necessary not to excessively raise the temperature of the integrated cicuit of which this detector may form a part. Finally, the detector thus made has to be a fast detector: it must have an operating speed which is as high as that of a logic gate.

An object of the invention is to provide a solution to these problems by proposing a detector essentially provided with two detecting circuits, which are parallel connected between the electrical power supply and the ground and are complementary with each other. Depending on the logic level introduced, one of the two circuits flips over and gives rise to an electrical consumption equivalent to the electrical consumption caused by the other circuit when the latter flips over to a different binary logic level. Judiciously, to prevent untimely electrical consumption outside of detection periods, these two circuits are activated and then deactivated at the moment of reception of each detected logic level. The deactivation signal subsequent to the activation signal of the detector can even be used to reset the detector at zero and make it available for a following detecting operation.

SUMMARY OF THE INVENTION

The invention therefore concerns a binary logic level electrical detector of the biased type, comprising means to receive a signal with a given logic level and to deliver a signal with a logic level corresponding to the received logic level, said detector comprising means to make its consumption independent of the logic levels delivered.

BRIEF DESCRIPTION OF THE DRAWINGS

The invention will be better understood from the following description and the accompanying figures which are given purely by way of example and in no way restrict the scope of the invention. Of these figures:

FIG. 1 gives a schematic view of a detector according to the invention;

FIG. 2 (a-e) shows timing diagrams of synchronization signals that come into play in the device of the invention.

DESCRIPTION OF A PREFERRED EMBODIMENT

FIG. 1 shows a binary logic level electrical detector 50 according to the invention. This detector has an input 1 to receive a signal of a given logic level and, in the example shown, two outputs 2 and 3 to deliver at least one signal of a logic level corresponding to the received logic level. Here, the two signals delivered are even complementary to each other. In its essential characteristics, the detector of the invention has means to make its consumption independent of the logic levels delivered. In the particular approach shown, the means used to make the consumption independent of the logic levels delivered essentially comprise two circuits, 4 and 5, biased at Vcc, parallel-connected with each other and both receiving the signal to be detected through an input 6 and 7 respectively.

The two circuits 4 and 5 have the special feature of having electrical consumption values that are complementary with respect to the binary logic levels to be detected. In the particular and preferred example shown, the two circuits 4 and 5 are even totally identical, thus ensuring that the complementary nature of the electrical consumption. They are differentiated only by the mode of connection of the components that constitute them.

Thus the circuit 4 has three series connected transistors, the transistors 8 to 10 respectively, while the circuit 5 has three other series connected transistors, the transistors 11 to 13. The transistors 8, 9, 11 and 12 are P-channel transistors (their gate has a little symbolic circle attached). These transistors have the specific feature, in being supplied with a positive voltage Vcc, of being on when they receive a zero electrical level (ground) at their gate and of being, on the contrary, off when they receive an electrical level of one (Vcc) at this gate. The transistors 10 and 13 are N-channel transistors: their operation is the reverse of the preceding operations. In the circuits 4 and 5, the three transistors are series connected between the supply potential Vcc and a common terminal receiving a signal CHEPR, complementary to a signal PRECH which is itself applied to the gates of the transistors 8 and 11. In a special embodiment, the gate of the transistor 10 is connected to the supply potential Vcc while the gate of the transistor 12 is connected to the ground. The gates of the remaining traansistors 9 and 13 are connected together to the input 1 of the detector. The output 2 of the detector is picked up at the mid-point of the transistors 8 and 9 while the output 3 is picked up at the mid-point of the transistors 11 and 12.

The signal PRECH is a pre-charging signal. It is complementary to the signal CHEPR, and is generally null while the latter equals Vcc. At the moment of detection, after a memory (for example a memory on a memory card) bit line pre-charging signal PRBL has been applied to the output of a decoder 14, depending on an address signal ADR, an order "i" bit line BLi is selected. The simultaneous selection of a word line then enables a particular word line WLj to address the information contained in a memory point "ij" to the decoder 14. This information is sent to the detector. The variation in the supply current occurs on several word lines, at the same time, so that its use for fraudulent decoding becomes impossible. Subsequently, when the detector receives the detection validating order, it flips over differently depending on the nature of the information available at its input 1.

Before the signal SD to be detected appears, the pre-charging signal PRECH equals zero and the signal CHEPR equals Vcc (FIG. 2). In this case, the two signals S2 and S3, available at the outputs 2 and 3, are equal to Vcc. In fact, the transistors 8 and 11 are conductive since, being P-channel transistors, they receive null potential at their gate: the voltage Vcc is therefore transmitted to the outputs 2 and 3. All the transistors 8 to 12 are then conductive and only the transistor 13 is off. After the application of the signal PRBL, which pre-charges the input of the detector and the bit lines at one, the reading of the cell takes place. The signal SD either remains at one or is discharged at zero. Once the level is stabilized, the signal PRECH flips over to Vcc and CHEPR flips over to zero. In a first example, the signal available at the input 1 is equal to zero. In this case, the transistor 13 stays off and the transistor 10 comes on. Thus, the output 2 goes to the zero state. On the contrary, the turning off of the transistor 11, the turning on of the transistor 12 and the turning off of the transistor 13 keep the output 3 at level 1. Conversely, if the signal emitted at input has a level one and is equal to Vcc, the transistors 12 and 13 come on and the output 3 flips over to zero while the output 2 remains at Vcc.

Regardless of the situation, the transistors 10 and 12 are still on. Their role is solely to make the two identical branches symmetrical. In this way, identical discharge speeds are obtained in both arms. Nor is it possible, by this fact, to use the discharging, by virtue of its repercussions on the supply circuit, as information liable to reveal the logic levels transmitted. At the end of the transmission, the signal PRECH falls back to zero and the signal CHEPR varies in a complementary way. The detector then resumes it initial state: transistors 8, 9, 10, 11 and 12 are on, the transistor 13 is off and the two outputs 2 and 3 are in the state Vcc. In this state, the detector consumes no current since the conducting transistors are connected, on either side, to equal potentials and since the other transistor is off.

When the detector performs its detection, at the flip-over moment, one of the two outputs 2 or 3 remains in the state Vcc while the other output returns to zero. The output that remains in the state Vcc is in fact in an unstable state at this potential. For this potential is picked up between two series-connected transistors which are off: transistors 8 and 9 when a zero state is available at the input 1 and transistors 11 and 12 when a state Vcc is available at the input 1. To keep the outputs 2 and 3 at this significant level, a bistable circuit such as, for example, the circuit 15 is used in series with each of the two outputs. The circuit 15 essentially has an inverter 16, connected in series with the output 2, and a P-channel transistor 17, parallel-connected between the supply Vcc and the input of the inverter 16. The output of the inverter 16 is looped back to the gate of the transistor 17. If a state one (Vcc) is available at the input of the inverter 16, a state zero is available at its output. Thus, the transistor 17 comes on and transmits the voltage Vcc to the input of the inverter 16 while maintaining the potential. If, on the contrary, the potential at the output 16 is null, the output of the inverter 16 is taken to Vcc, thus turning the transistor 17 off and thus effectively keeping the input of the inverter 15 at zero.

In a preferred alternative embodiment, the two circuits 4 and 5 are even coupled to each other by means of their respective bistable circuits 15 and 18. To this end, the output of the circuit 15, namely the output of the inverter 16, is connected by a connection 19 to the gate of the transistor 12, and the ground connection of this gate of the transistor is cut off. For the same purpose, the input of the bistable circuit 18, i.e. in the final analysis the output 3 of the detector, is connected by a connection 20 to the gate of the transistor 10, and the connection to the Vcc supply of the gate of the transistor 10 is cut off. These latter two connections are shown with dashes in FIG. 1. This type of connection forms a stable three-state assembly for the detector set. Outside of detection periods, the outputs 2 and 3 are at Vcc, the output of the bistable circuit at zero and the new connections 19 and 20 keep the gates of the transistors 12 and 10, respectively, in the same states as described up to now. During a detection, one of the two outputs is taken to Vcc while the other output is taken to zero. When the output 2 is taken alone to Vcc (a logic level one is available at the input 1), the transistor 12 receives a null potential: nothing has changed for this transistor. On the contrary, the transistor 10 also receives a null potential, and it therefore also tends to go off. The result of this is that, if a spurious phenomenon comes into play (for example a breakdown of the voltage delivered by the memory), tending make the input 1 go to level zero, then the transistor 9 can come on without causing deterioration in the level of the potential available at the output 2, since the turning off of the transistor 10 ensures the value of this output potential at Vcc.

In the other case, when a logic level zero is to be detected at the input of the detector, the output 3 is taken to a potential Vcc while the output 2 is taken to zero. The result of this is that the transistor 10 receives a voltage Vcc at its gate. Nothing has changed for it with respect to its prior connection scheme. On the contrary, the transistor 12 now receives a signal biased at Vcc at its gate. Since the transistor 12 is a P-channel transistor, it goes off. Consequently, the output 3, taken between two off transistors, namely the transistors 11 and 12, remains at its potential, namely the potential Vcc. It stays at this potential even if a spurious phenomenon occurs. When the pre-charging signals PRECH and CHEPR resume their standby value, the outputs of the signals 15 and 16 both fall back to zero.

The connection mode thus achieved therefore possesses the advantage of having three stable states, one detection standby stable state and two stable states depending on the detected logic level. In the two stable states that depend on the detected logic level, the circuit is capable of taking transient phenomena into account and of keeping the information regardless of random phenomena which the information to be detected may subsequently undergo. This mode of operation is especially worthwhile when the precaution is taken, before reading other memory cells, of discharging the word lines WLj with a Vss voltage (negative) after a previous reading. This precaution, which improves the reliability of the operation for reading the information contained in the memory cell, created difficulties in terms of taking the information read into account.

In logic circuits located upline, one of the signals delivered by the bistable circuits or even both signals can be used. In these upline logic circuits, the processing undergone by the signals makes it impossible to decode them in a fraudulent way. In a preferred manner, a detector according to the invention is incorporated in the integrated circuit borne by a memory card. It occupies little space and its making does not entail any special stages for the manufacture of this integrated circuit. Only one detector is used for a card.

What is claimed is:

1. A binary logic level electrical detector of the biased type, comprising means to receive a signal with a given logic level and to deliver a signal with a logic level corresponding to the received logic level, said detector comprising means to make its electrical consumption independent of the logic levels delivered.

2. A detector according to claim 1 wherein the means used to make the electrical consumption independent of the logic levels delivered comprise two biased circuits, in parallel, both receiving the signal to be detected and having consumption levels that are complementary with respect to each of the two logic levels.

3. A detector according to claim 2 each circuit comprises an activation command to activate the detector when a level has to be detected and to deactivate the detector outside of these periods, the de-activation command being used to reset the detector at zero.

4. A use of a detector, according to any of the claims 1 to 3, as a read amplifier in a system for the reading of the information contained in a memory circuit of a memory card of the type having an integrated circuit memory.

5. A use according to claim 4 wherein the detector forms an integral part of the integrated circuit in the memory card.

6. A detector according to any of the claims 1 to 3, comprising a circuit for maintaining the delivered logic level to improve the detection of transitory, received logic levels.

7. A device according to claim 2 or 3 wherein the two circuits comprise means in order to be coupled and to keep each other in their mutually respective states.

8. A device according to claim 2 or 3 wherein each circuit has at least three transistors connected in series.

9. A memory card of the type having an integrated circuit, the improvement comprising a novel detector formed as an integral part of said integrated circuit, and used as a read amplifier in a system for the reading of information contained in a memory circuit of the memory card, said detector being a binary logic level electrical detector of the biased type, comprising means to receive a signal with a given logic level and to deliver a signal with a logic level corresponding to the received logic level, said detector further comprising means to make its electrical consumption independent of the logic levels delivered.

10. A memory card of the type having an integrated circuit, the improvement comprising a novel detector, formed as an integral part of said integrated circuit and used as a read amplifier in a system for the reading of information contained in a memory circuit of the memory card, said detector being a binary logic level electrical detector of the biased type, comprising means to receive a signal with a given logic level and to deliver a signal with a logic level corresponding to the received logic level, said detector further comprising means to make its electrical consumption independent of the logic levels delivered, and wherein the means used to make the electrical consumption independent of the logic levels delivered comprise two biased circuits, in parallel, both receiving the signal to be detected and having consumption levels that are complementary with respect to each of the two logic levels.

* * * * *